(12) United States Patent
Husak

(10) Patent No.: US 7,119,719 B2
(45) Date of Patent: Oct. 10, 2006

(54) DEVICE AND METHOD FOR IMPROVED TEXT ENTRY ON AN ALPHANUMERIC KEYPAD

(75) Inventor: Anton T. Husak, Orange, CA (US)

(73) Assignee: AT&T Wireless Services, Inc., Redmond, WA (US)

( * ) Notice: Subject to any disclaimer, the term of this patent is extended or adjusted under 35 U.S.C. 154(b) by 474 days.

(21) Appl. No.: 10/609,034

(22) Filed: Jun. 27, 2003

(65) Prior Publication Data

US 2004/0263360 A1    Dec. 30, 2004

(51) Int. Cl.
*H03K 17/94* (2006.01)
*H03M 11/00* (2006.01)
*G09G 1/00* (2006.01)

(52) U.S. Cl. .......................... 341/22; 341/23; 345/175
(58) Field of Classification Search ................ 341/22, 341/23; 700/84; 345/175
See application file for complete search history.

(56) References Cited

U.S. PATENT DOCUMENTS

| 5,007,008 A * | 4/1991 | Beers ........................ 708/145 |
| 6,765,556 B1 * | 7/2004 | Kandogan et al. .......... 345/168 |
| 2004/0070522 A1 * | 4/2004 | Tsubai et al. ................. 341/22 |

* cited by examiner

*Primary Examiner*—Jeffery Hofsass
*Assistant Examiner*—Sisay Yacob
(74) *Attorney, Agent, or Firm*—Zagorin O'Brien Graham LLP

(57) ABSTRACT

A device and method wherein, using a keypad such as a standard alphanumeric telephone-style keypad, text entry is improved by employing a key-press combination which indicates which of the multiple characters associated with a key is chosen. The user will push-and-hold a first key, then press a second key; the position within the keypad, such the row number, of the first key indicates which of the characters represented by the second key are chosen. In this way, any standard character can be selected with a two-key combination.

27 Claims, 2 Drawing Sheets

DEVICE AND METHOD FOR IMPROVED TEXT ENTRY ON AN ALPHANUMERIC KEYPAD

TECHNICAL FIELD OF THE INVENTION

The present application relates to a user input device for entering alphanumeric data on a device having relatively few data entry keys, and more particularly to a keypad for entering alphanumeric data on a portable communication unit.

BACKGROUND OF THE INVENTION

Portable electronic devices with text entry capabilities are increasing in usage. These devices are being built in smaller sizes each year. For many of these devices, such as cellular phones, models that are small in size are perceived as desirable by consumers. Cellular phone manufacturers have responded to this, and produce a variety of cellular phones that are small relative to earlier models, with some models being smaller than the size of a user's palm.

Cellular phones have a number of features that require a user to input alphanumeric characters. A user may, for example, enter alphanumeric text in the name field of a phone list maintained in the phone. A user may also use a cell phone to send text messages via short messaging service (SMS) technology. To do this, a user generally inputs alphanumeric characters into the phone. Typically, a numeric keypad is used to enter alphanumeric characters, where the number of alphanumeric characters exceeds the number of numeric input keys.

A technique generally used to enter alphanumeric characters into a phone uses a standard alphabetic arrangement illustrated in FIG. 1. In this method a cellular phone has two data entry modes, a numeric mode and an alphanumeric mode. In the numeric mode, activation of the data entry keys represents numeric digits. The numeric digits are determined from the correspondence between each data entry key and the numeric digit associated with that key. In a standard telephone, activation of data entry keys in numeric mode generates dual tone multifrequency (DTMF) signals in accordance with an industry standard.

When operating in the alphanumeric mode, single activation of a data entry key is interpreted as a user selection of the first letter in the sequence of letters that are assigned to the particular data entry key. Similarly, when a data entry key is activated twice by a user, this is interpreted as a selection of the second letter in the sequence of letters associated with that particular data entry key. A timeout threshold is used to determine when selection of a character is complete. If a period of time equal to the timeout threshold follows the activation of a key without a subsequent activation of a key, the selection of the character is considered to be completed. Also, if the user activates a first key followed by an activation of a different key, the activation of the second key is considered to be the beginning of the selection of a new character.

With this method, a user may activate a key one, two, three, or four times in order to select a particular letter of the alphabet. Multiple activations of keys increase the time required to enter text using the keypad.

In addition to use of the keys to enter alphanumeric data, letters on keys assist users in entering telephone numbers or other numeric data. Some telephone numbers are represented by mnemonic phone numbers, in which at least part of the phone number is specified by the use of letters, to assist in memorization of the number. For example, 1-800-ABCDEFG is equivalent to 1-800-2223334, when a user activates each key once for each number or letter in the mnemonic phone number.

Because entry of alphanumeric characters on a limited keypad is less efficient than on a full sized keyboard, a mechanism for improving the efficiency is desirable. Changes to increasing efficiency can be problematic because users are familiar with the standard key mapping. Also, the use of mnemonic telephone numbers is a further consideration.

There is, therefore, a need in the art for an improved device and method for entering alphanumeric data in a portable communications device.

SUMMARY OF THE INVENTION

To address the above-discussed deficiencies of the prior art, it is a primary object of the present invention to provide an improved user input device and method for entering alphanumeric data on a device having relatively few data entry keys.

The preferred embodiment provides that, using a standard alphanumeric telephone-style keypad, text entry is improved by employing a key-press combination which indicates which of the multiple characters associated with a key is chosen. The user will push-and-hold a first key, then press a second key; the row number of the first key indicates which of the characters represented by the second key are chosen. In this way, any standard character can be selected with a two-key combination.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
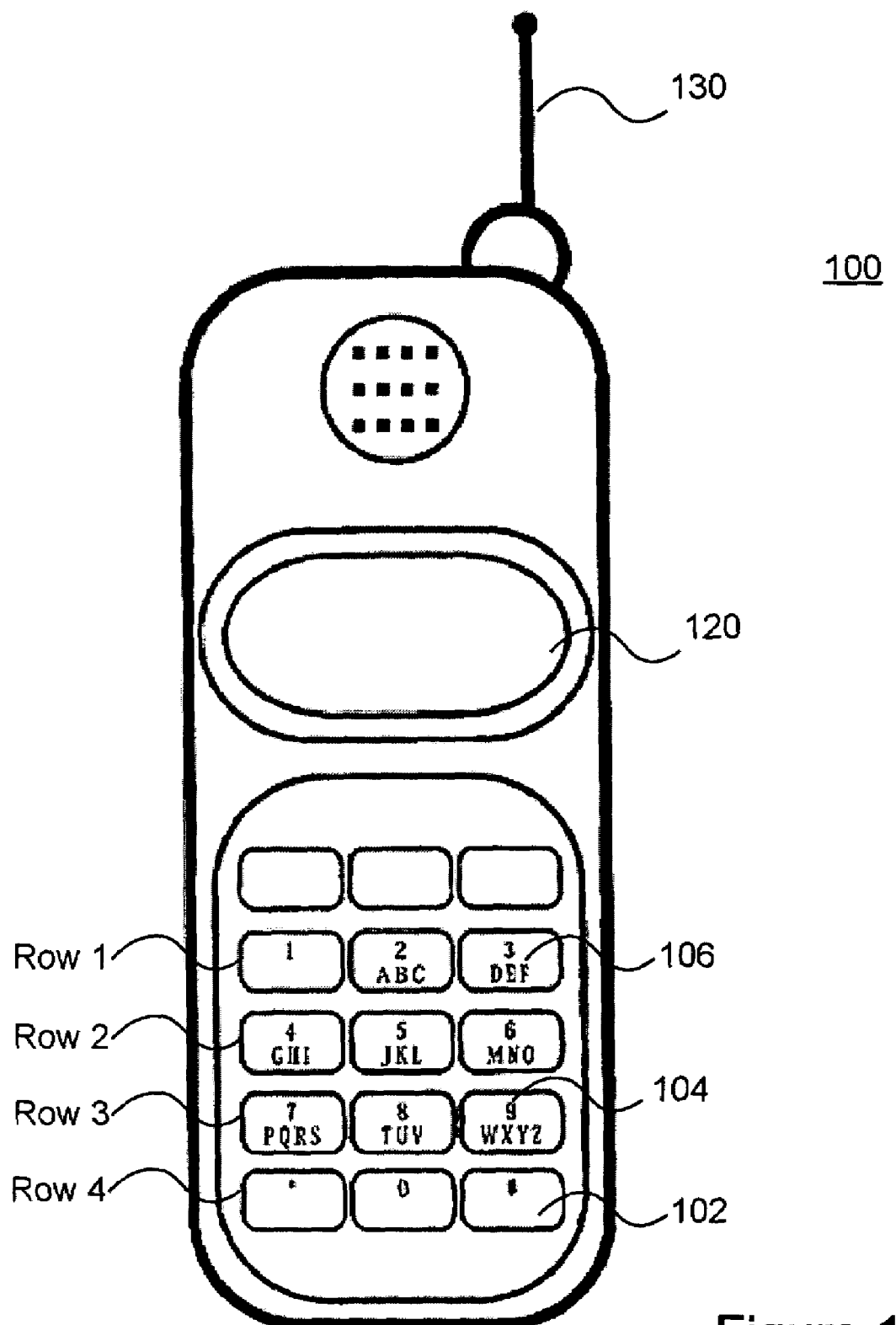
FIG. 1 depicts a device in accordance with a preferred embodiment of the present invention.
Figure 2:
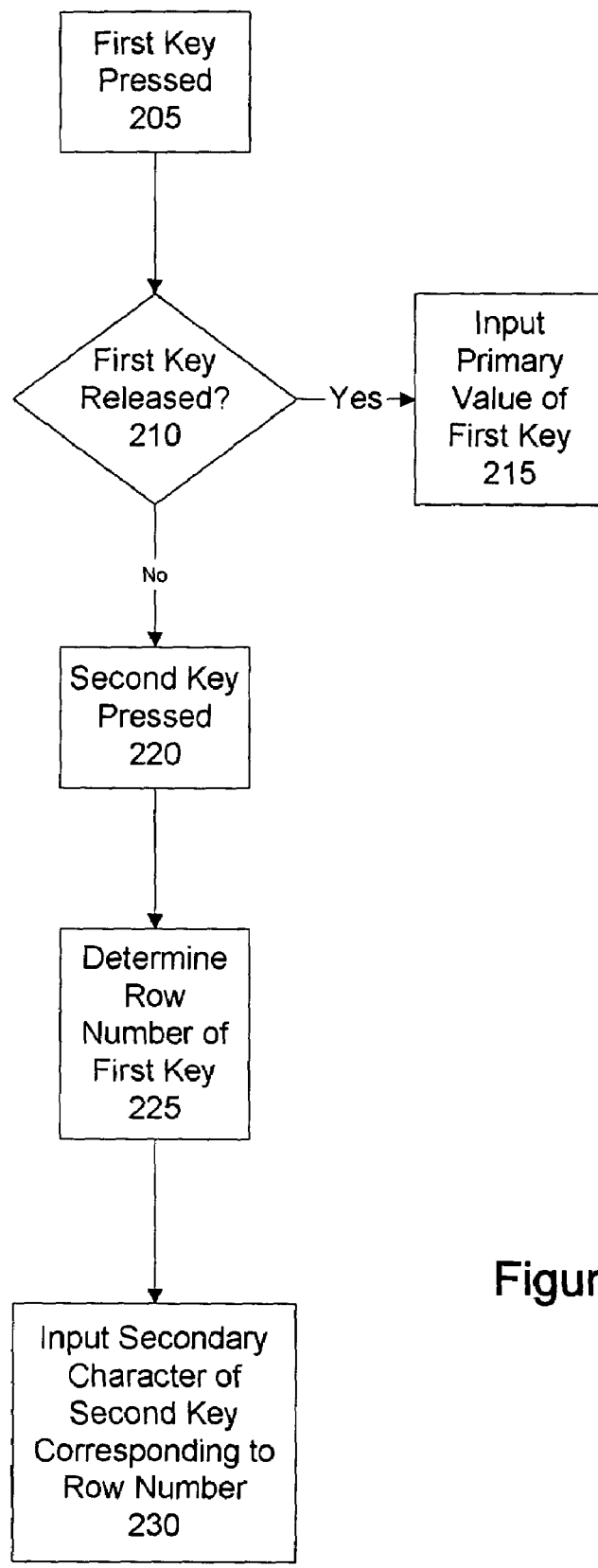
FIG. 2 depicts a process in accordance with a preferred embodiment of the present invention.

FIGS. 1 and 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device. The numerous innovative teachings of the present application will be described with particular reference to the presently preferred embodiment.

The preferred embodiment is a device and method for mobile telephone devices with common 10-digit, 12-key keypads that makes it faster and easier for the user to enter text messages by use of a variable "shift" feature that selects secondary characters associated with a key based upon the position in the keypad of a depressed "shift" key.

The preferred embodiment provides that, using a standard alphanumeric telephone-style keypad, text entry is improved by employing a key-press combination which indicates which of the multiple characters associated with a key is chosen. The user will push-and-hold a first key, then press a second key; the row number of the first key indicates which of the characters represented by the second key are chosen. In this way, any standard character can be selected with a two-key combination.

FIG. 1 depicts a wireless device with a standard keypad 100 wherein twelve keys 102 are arranged in four rows of three keys. Each key has a primary character 104 and a plurality of secondary characters 106 associated with it. The primary character 104 displayed on each key 102 is, in this embodiment, selected from the group of characters 1, 2, 3, 4, 5, 6, 7, 8, 9, 0, # and *. The secondary characters 106 associated with each key are shown in groups adjacent the respective key.

The secondary character groupings in this embodiment are similar to those of the multitap method, for example the key associated with primary character "2" has an associated secondary character grouping "abc", the key "3" the associated secondary characters "def" and so on as shown in the figure. Hence, keypad 100 as shown in FIG. 1 presents to the user a keypad having a well known key and character layout, thereby necessitating little or no familiarization. The wireless device has a processor coupled with the keypad 100, display 120, transceiver, memory, and antenna 130. The processor, transceiver and memory are not shown for clarity but are understood to be present.

The standard keypad has four rows of keys, shown here as Row 1, with primary characters 1, 2, and 3; Row 2, with primary characters 4, 5, and 6; Row 3, with primary characters 7, 8, and 9; and Row 4, with primary characters *, 0, and #. Note that there may be other keys or rows of keys on the keypad, but only the four rows described above are utilized in the preferred method.

Using the known "multitap" method, to enter a single letter, for a short message service (SMS) message or any other text entry, a key may have to be pressed as many as 4 times. By changing the keypad reading algorithm in accordance with the method described herein, any key can work as either a letter entry key or a "shift" key.

For example, if the user presses and holds any key in Row 1 of the keypad, the first letter on the next key pressed will be entered. If the user presses and holds any key in the Row 2, the second letter represented by the next key pressed would be entered and so on.

Therefore, instead of having to press the 9 button four times to enter the letter "Z", one would simply press and hold a key in the fourth row (perhaps "*" or "0") and press the 9 button once.

If first key is released before the next key is pressed, then the device will read that as the primary character, 0–9, *, or #.

By implementing this new method in the phone software, the user will be able to enter text messages approximately twice as fast as before.

FIG. 2 depicts a flowchart of a process in accordance with the preferred embodiment. According to this process, the device receives the input of a first key (step 205). Necessarily, when any key is pressed, the device can identify which key it is, including the key's row and column. Each key has associated with it a primary input value, preferably 0–9, *, and #, and multiple secondary input values, preferably letters of the alphabet.

If the first key is then released before another key is pressed (step 210), the device accepts the primary value of the first key as the result value input (step 215).

If the first key is not released (step 210) before a second key is pressed (step 220), providing a second input, then one of the secondary characters of the second key is chosen. The system takes the row number of the first key (step 225) and takes the corresponding secondary character of the second key as the result value input (step 230).

Of course, those of skill in the art will recognize that not all steps in the process described above must necessarily be performed in the order described. For example, rather than pressing and holding a first key to indicate which of the secondary characters associated with the second key is to be selected, the invention could also be implemented by the reverse key-press logic: pressing and holding the first key, then pressing a second key to indicate which of the secondary characters associated with the first key is to be selected. Further, the row-based operations described herein can easily be implemented as column-based operations, by slightly changing the alphanumeric key assignments to account for only 3 columns versus 4 rows, by adding a fourth column of keys, or by rearranging the traditional 12-key keypad into a configuration with at least four columns.

The commercial benefits of using this process are that the user will be able to much more quickly enter text messages in the phone, for labeling purposes and to send SMS or other messages. Also since the speed of messaging is increased, SMS becomes more natural, prompting higher SMS usage. Once the user has become used to the concept and key sequences, speeds equivalent to a full alphanumeric keypad can be obtained. Since there are fewer keys involved, it is likely that this method of text entry would actually be faster than one could achieve on a full keypad, such as that found on the Blackberry device.

Those skilled in the art will recognize that, for simplicity and clarity, the full structure and operation of all devices suitable for use with the present invention is not being depicted or described herein. Instead, only so much of a mobile communications device as is unique to the present invention or necessary for an understanding of the present invention is depicted and described. The remainder of the construction and operation of data processing system 100 may conform to any of the various current implementations and practices known in the art.

It is important to note that while the present invention has been described in the context of a fully functional system, those skilled in the art will appreciate that at least portions of the mechanism of the present invention are capable of being distributed in the form of instructions contained within a machine usable medium in any of a variety of forms, and that the present invention applies equally regardless of the particular type of instruction or signal bearing medium utilized to actually carry out the distribution. Examples of machine usable mediums include: nonvolatile, hard-coded type mediums such as read only memories (ROMs) or erasable, electrically programmable read only memories (EEPROMs), user-recordable type mediums such as floppy disks, hard disk drives and compact disk read only memories (CD-ROMs) or digital versatile disks (DVDs), and transmission type mediums such as digital and analog communication links.

Although an exemplary embodiment of the present invention has been described in detail, those skilled in the art will understand that various changes, substitutions, variations, and improvements of the invention disclosed herein may be made without departing from the spirit and scope of the invention in its broadest form.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC §112 unless the exact words "means for" are followed by a participle.

What is claimed is:

1. A method for receiving input in a device having an alphanumeric keypad, comprising:
   receiving a first input corresponding to the press of a first key, the first key having row value, a primary input value, and a plurality of secondary input values;
   receiving a second input corresponding to the press of a second key, the second key having a primary input value and a plurality of secondary input values;
   if the press of the first key is released before the press of the second key is received, then generating a result value corresponding to the primary input value of the first key; and
   if the press of the first key is not released before the press of the second key is received, then generating a result value corresponding to the secondary input value of the second key indicated by the row value of the first key.

2. The method of claim 1, further comprising, if the press of the first key is released before the press of the second key is received, then generating a subsequent result value corresponding to the primary input value of the second key.

3. The method of claim 1, wherein the primary input value of the first key is a numeric character.

4. The method of claim 1, wherein the secondary input values of the second key are alphabetic characters.

5. The method of claim 1, wherein the device is a mobile telecommunications device.

6. The method of claim 1, wherein, if the row value of the first key is equal to 1, then the first of the secondary input values of the second key is selected as the result code.

7. The method of claim 1, wherein the method is repeated for subsequent key presses.

8. The method of claim 1, wherein a character corresponding to the result value is displayed.

9. The method of claim 1, wherein the row value of the first key corresponds to the physical row placement of the key on the alphanumeric keypad of the device.

10. The method of claim 1, wherein the alphanumeric keypad is a standard telephone keypad.

11. A device having an alphanumeric keypad, comprising:
    means for receiving a first input corresponding to the press of a first key, the first key having row value, a primary input value, and a plurality of secondary input values;
    means for receiving a second input corresponding to the press of a second key, the second key having a primary input value and a plurality of secondary input values;
    means for generating a result value corresponding to the primary input value of the first key if the press of the first key is released before the press of the second key is received; and
    means for generating a result value corresponding to the secondary input value of the second key indicated by the row value of the first key if the press of the first key is not released before the press of the second key is received.

12. The device of claim 11, further comprising means for generating a subsequent result value corresponding to the primary input value of the second key, if the press of the first key is released before the press of the second key is received.

13. The device of claim 11, wherein the primary input value of the first key is a numeric character.

14. The device of claim 11, wherein the secondary input values of the second key are alphabetic characters.

15. The device of claim 11, wherein the device is a mobile telecommunications device.

16. The device of claim 11, wherein, if the row value of the first key is equal to 1, then the first of the secondary input values of the second key is selected as the result code.

17. The device of claim 11, wherein a message is formed via subsequent key presses.

18. The device of claim 11, wherein a character corresponding to the result value is displayed.

19. The device of claim 11, wherein the row value of the first key corresponds to the physical row placement of the key on the alphanumeric keypad of the device.

20. The device of claim 11, wherein the alphanumeric keypad is a standard telephone keypad.

21. A method for receiving input in a device having an alphanumeric keypad, comprising:
    providing an alphanumeric keypad having keys arranged in a plurality of rows, each key having multiple input values;
    receiving a keypress entry of one of the keys;
    determining an input value for the key, of the multiple input values, according to whether a second key is concurrently pressed and, if a second key is concurrently pressed, the row number of the second key.

22. A computer program product stored in a machine-readable medium, comprising:
    instructions for receiving a first input corresponding to the press of a first key, the first key having row value, a primary input value, and a plurality of secondary input values;

instructions for receiving a second input corresponding to the press of a second key, the second key having a primary input value and a plurality of secondary input values;

instructions for generating a result value corresponding to the primary input value of the first key, if the press of the first key is released before the press of the second key is received; and instructions for generating a result value corresponding to the secondary input value of the second key indicated by the row value of the first key, if the press of the first key is not released before the press of the second key is received.

23. A mobile communication device, comprising:

a keypad having keys associated with a primary alphanumeric character and secondary alphanumeric characters; and a processor coupled with the keypad, the processor programmed to select from among the secondary alphanumeric characters associated with a first key based upon the keypad position of a second key that is pressed concurrently with the first key.

24. The mobile communication device of claim 23, wherein the keypad position of the second key is the row in which the second key is located in the keypad.

25. The mobile communication device of claim 23, wherein the keypad position of the second key is the column in which the second key is located in the keypad.

26. The mobile communication device of claim 23, wherein the selection is according to the number of the row in which the second key is located in the keypad.

27. The mobile communication device of claim 23, wherein the selection is according to the number of the column in which the second key is located in the keypad.

* * * * *